United States Patent [19]

Lebow et al.

[11] 4,306,925

[45] Dec. 22, 1981

[54] METHOD OF MANUFACTURING HIGH DENSITY PRINTED CIRCUIT

[75] Inventors: Sanford Lebow, Westlake Village; Daniel Nogavich, Newbury Park, both of Calif.

[73] Assignee: Pactel Corporation, Newbury Park, Calif.

[21] Appl. No.: 187,777

[22] Filed: Sep. 16, 1980

Related U.S. Application Data

[60] Continuation of Ser. No. 38,457, May 14, 1979, abandoned, which is a division of Ser. No. 758,442, Jan. 11, 1977, abandoned.

[51] Int. Cl.³ ............................................. H05K 3/00
[52] U.S. Cl. ...................................... 156/150; 29/848; 156/154; 156/247; 156/634; 156/902; 174/68.5; 204/15; 430/313; 430/315
[58] Field of Search ............... 156/150, 151, 233, 235, 156/247, 249, 300, 629, 634, 656, 659.1, 661.1, 303.1, 632, 631, 153, 901, 902, 154; 29/846, 848; 430/313, 315, 316, 318; 174/68.5, 98, 116; 204/15; 264/271, 272; 427/96

[56] References Cited

U.S. PATENT DOCUMENTS

| | | | |
|---|---|---|---|
| 2,254,429 | 9/1941 | Kreutzer | 29/423 UX |
| 2,387,631 | 10/1945 | Weir | 156/205 X |
| 2,695,351 | 11/1954 | Beck | 29/846 X |
| 2,728,693 | 12/1955 | Cado | 204/15 X |
| 2,748,048 | 5/1956 | Russell | 156/289 X |
| 2,874,085 | 2/1959 | Brietzke | 156/233 X |
| 3,052,823 | 9/1962 | Anderson et al. | 174/68.5 X |
| 3,152,938 | 10/1964 | Osifchin et al. | 156/901 X |
| 3,181,986 | 5/1965 | Pritikin | 156/233 |
| 3,324,014 | 6/1967 | Modjeska | 29/625 UX |
| 3,331,718 | 7/1967 | Ruffing | 156/656 |
| 3,347,724 | 10/1967 | Schneble et al. | 156/151 |
| 3,405,227 | 10/1968 | Hazlett | 29/625 X |
| 3,440,027 | 4/1969 | Hugle | 174/68.5 X |
| 3,526,573 | 9/1970 | Kepple et al. | 174/68.5 X |
| 3,536,545 | 10/1970 | Traynor et al. | 156/656 X |
| 3,622,384 | 11/1971 | Davey et al. | 174/68.5 X |
| 3,648,131 | 3/1972 | Stuby | 357/28 X |
| 3,704,455 | 11/1972 | Scarbrough | 340/173 SP |
| 3,711,626 | 1/1973 | Kilby et al. | 174/68.5 |
| 3,791,858 | 2/1974 | McPherson et al. | 156/627 X |
| 3,818,279 | 6/1974 | Seeger et al. | 174/68.5 X |
| 3,832,769 | 9/1974 | Olyphant et al. | 174/68.5 X |
| 3,838,984 | 10/1974 | Crane et al. | 174/52 PE |
| 3,871,930 | 3/1975 | Fish | 252/79.5 X |
| 3,947,957 | 4/1976 | Luttmer | 29/589 X |
| 3,990,926 | 11/1976 | Konicek | 156/151 X |
| 4,073,699 | 2/1978 | Hutkin | 204/13 |

OTHER PUBLICATIONS

An Introduction to Photofabrication Using Kodak Photosensitive Resists, Aug. 30, 1967, p. 22.
IBM Technical Disclosure Bulletin, vol. 10, No. 4, Sep. 1967, Multi-Layer Circuit Fabrication by A. E. Peter et al., pp. 359-360, 29-625.

Primary Examiner—William A. Powell
Attorney, Agent, or Firm—Fraser and Bogucki

[57] ABSTRACT

A printed circuit which may be highly flexible in configuration and design includes at least one uniformly thick, planar circuit layer including a conductive circuit pattern and an insulating circuit pattern of a cured, flowable insulating material. The printed circuit may include multiple circuit layers that are selectively electrically connected to other layers and may provide circuit patterns, mechanically supportive insulator patterns and windows in almost any desired configuration. The printed circuit may be bonded to a substrate in a high thermal transfer configuration, implemented as a film carrier having plated conductors extending from the surface to receive directly pads of integrated circuit chips or used as a high strength, low coefficient of thermal expansion flexible cable. The printed circuit is manufactured by forming a first conductive circuit pattern on a polished temporary substrate, forming a second conductive circuit pattern (which may be an interconnect pattern) on the first pattern if desired, laminating a flowable insulator material to the first and second conductive circuit layers and temporary substrate to form first and second insulator layers, sanding to form a smooth top surface coplanar with the top of the top conductive pattern, selectively adding additional layers and a substrate and stripping the printed circuit from the temporary substrate. The conductive patterns may be formed with high resolution using photolithographic techniques.

9 Claims, 14 Drawing Figures

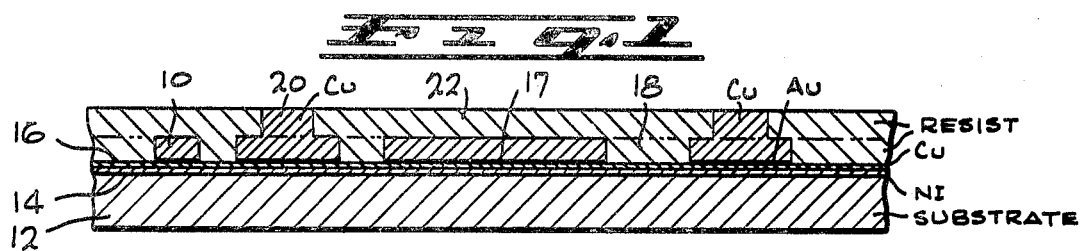
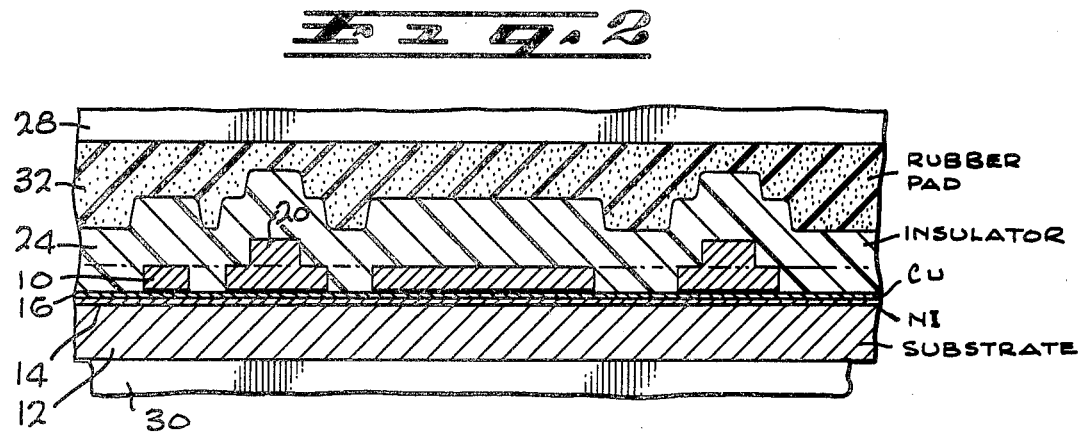
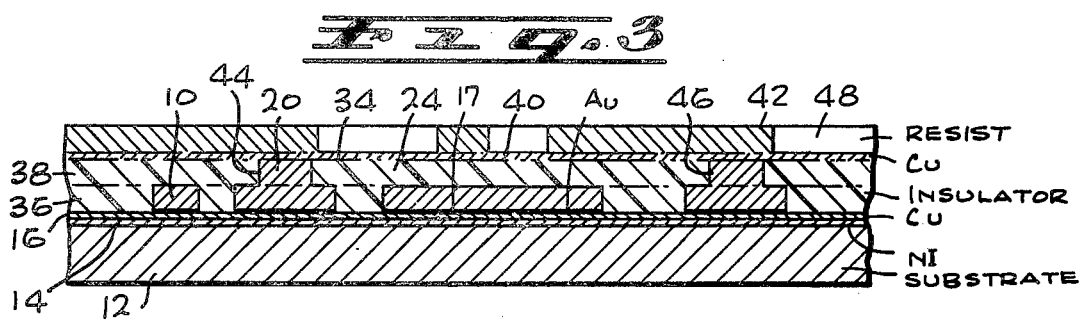
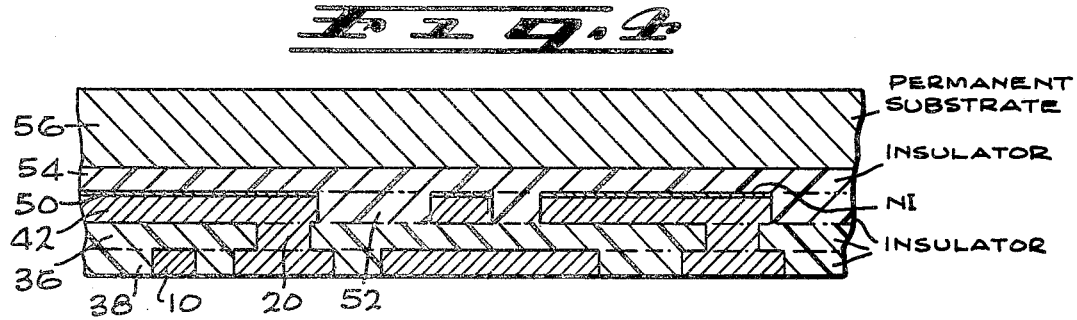
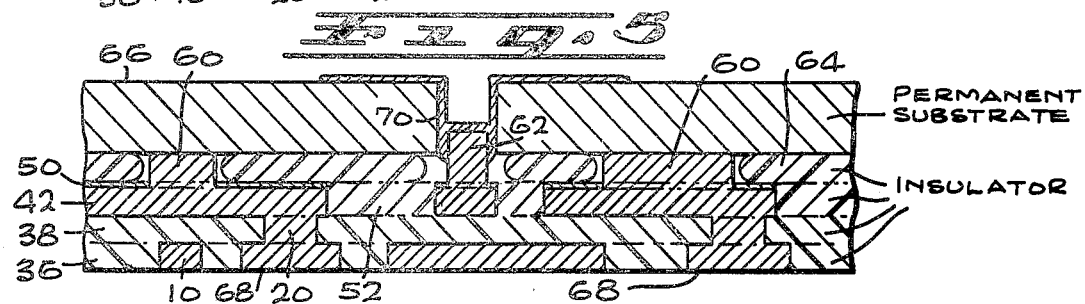

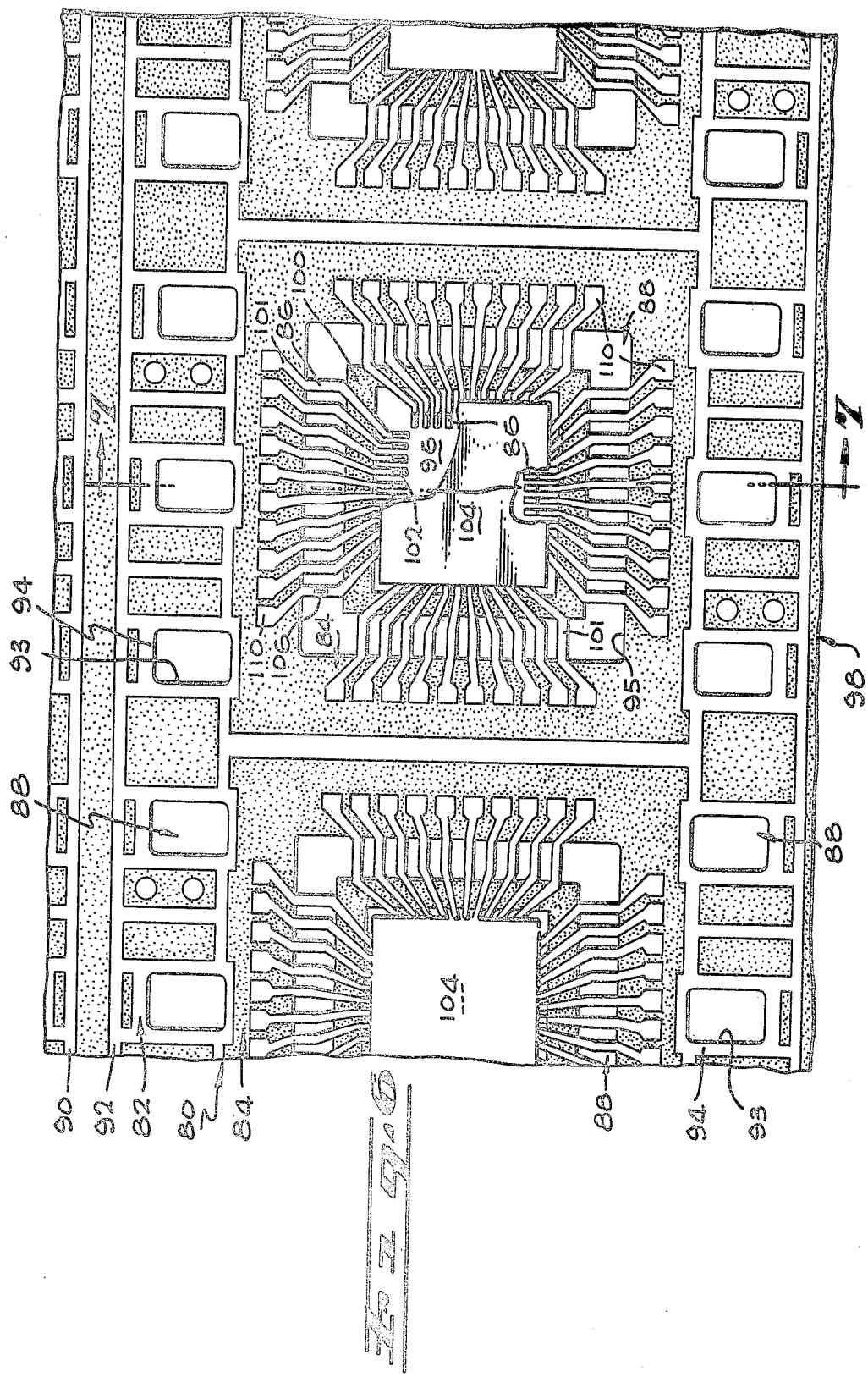

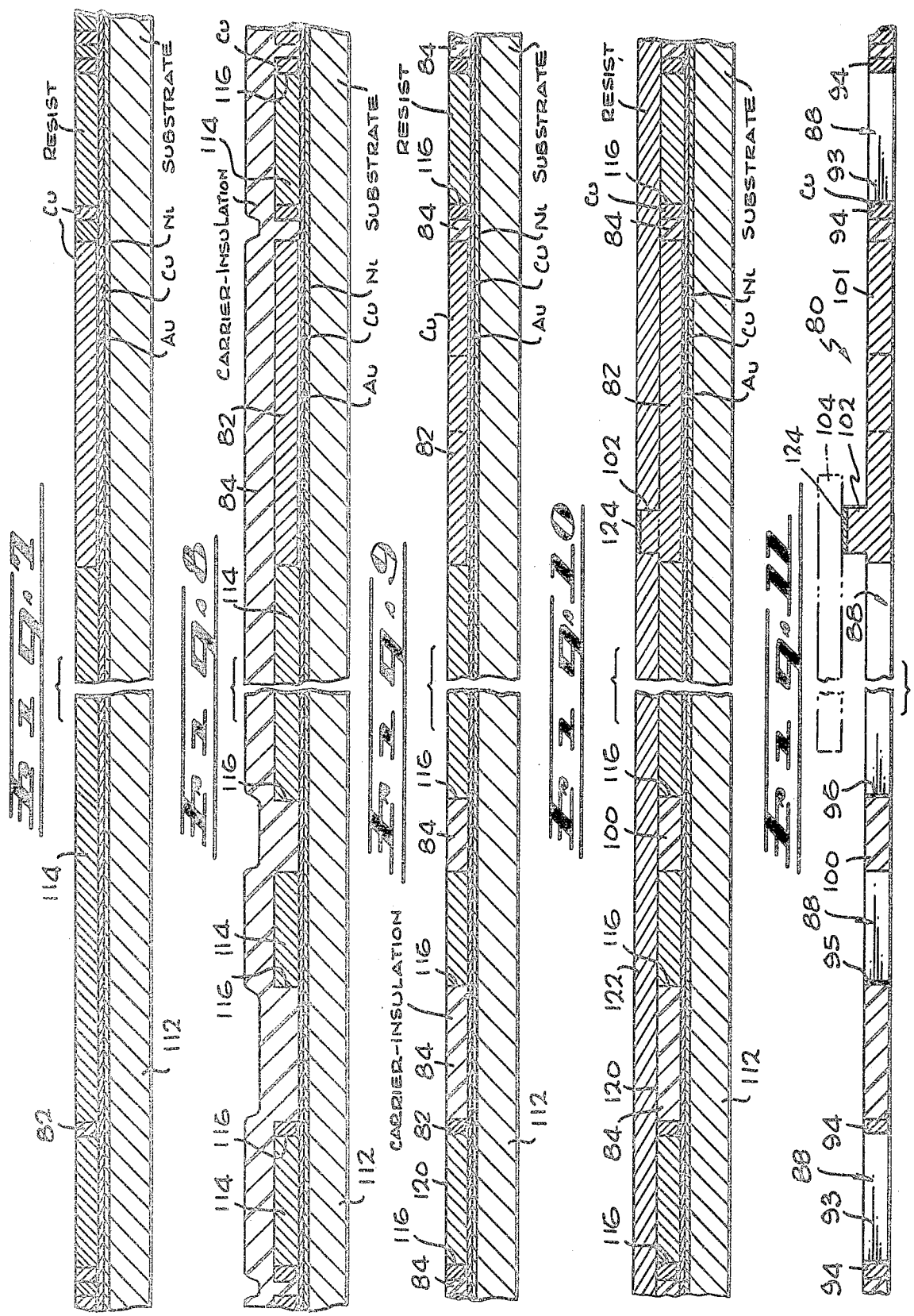

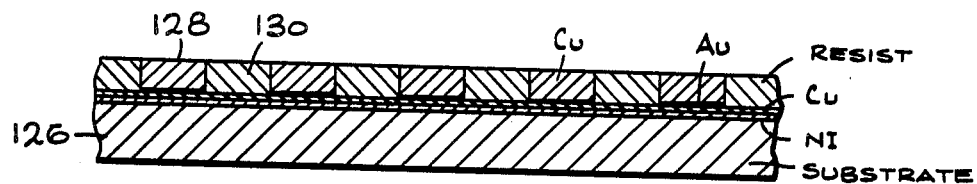
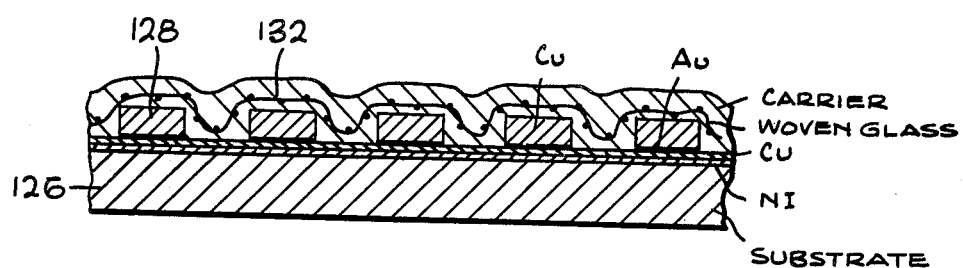
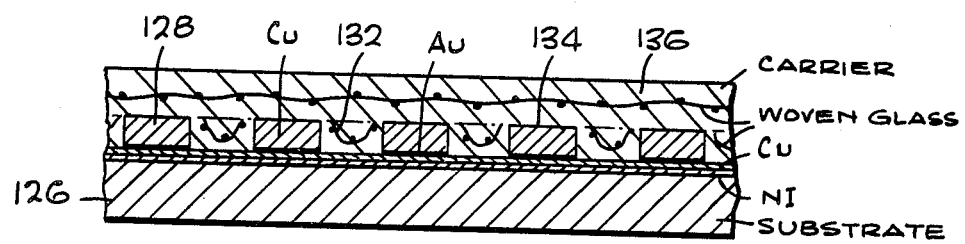

METHOD OF MANUFACTURING HIGH DENSITY PRINTED CIRCUIT

CROSS-REFERENCE TO RELATED APPLICATIONS

This application is a continuation of Ser. No. 038,457, filed May 14, 1979, now abandoned which was a division of Ser. No. 758,442, filed Jan. 11, 1977, now abandoned with continuation application Ser. No. 053,755 having been filed on Nov. 30, 1979, now abandoned.

This application is related to application Ser. No. 758,441 filed Jan. 11, 1977, for "Method of Manufacturing High Density, Fine Line Printed Circuitry" now U.S. Pat. No. 4,159,222.

BACKGROUND OF THE INVENTION

1. Field of the Invention

This invention relates to printed circuits and methods of manufacture which permit the achievement of high density, multilayer circuits using photolithographic techniques and with a highly adaptable physical structure.

2. Description of the Prior Art

Printed circuits provide a quick, convenient and economical means of selectively interconnecting multiple circuit components which might include simple capacitors, inductors and resistors; active components ranging from simple diodes to complex integrated circuit chips; or even other printed circuits having components mounted thereon. As technology has advanced the need has arisen for printed circuits which may have more layers of more complex printed circuitry and which may have greater flexibility of physical structure while remaining economical.

One of the most common printed circuit arrangements is a phenolic resin, glass, metal or other substrate having conductive printed circuitry printed on one or both sides. However, such arrangements are limited in circuit density, require plated through holes for interconnection between sides and consume considerable surface area, thereby reducing the area available for desired conductive circuit patterns.

It is also known to form printed circuits on temporary substrates as described in U.S. Pat. Nos. 2,692,190; 2,721,822; 2,724,674; and 3,181,986. However, the arrangements do not lend themselves to the high density, fine line resolution, multilayer printed circuits of the type taught herein. A multilayer printed circuit using a permanent dielectric substrate is taught in U.S. Pat. No. 3,350,498. However, this arrangement uses 70 mil thick circuit layers compared to circuit layers varying from 0.6 mil to several mils for the present invention and is not compatible with high resolution photolithographic techniques.

SUMMARY OF THE INVENTION

An extremely adaptive high resolution printed circuit in accordance with the invention includes at least one uniformly thick, planar circuit layer having a conductive circuit pattern equal in thickness to the thickness of the circuit layer and extending within the plane of the circuit layer and an insulator pattern equal in thickness to the thickness of the circuit layer and extending within the plane of the circuit layer. The insulator pattern comprises a flowable insulator material that mates with and bonds to at least a portion of the conductive circuit pattern. Additional layers may be added to a first layer and selectively interconnected to provide a multilayer printed circuit. The conductive circuit pattern may be configured to provide improved heat transfer to a permanent metal substrate. Alternatively the substrate may be omitted and the circuit layers provided with windows and perpendicularly extending conductors for use as a film carrier connecting an integrated circuit to a lead frame. The substrate-free printed circuit may also be configured as a single or multiple layer flexible cable and glass fiber material may be embedded within the insulator material. Use of a woven glass fiber increases strength and decreases the coefficient of thermal expansion.

A printed circuit in accordance with the invention is manufactured by forming a conductive circuit pattern on a releasable polished surface of a substrate which may be a stainless steel substrate, forming an insulator pattern using the conductive circuit pattern to at least partially define the insulator pattern, and removing material by sanding or otherwise to form a planar, uniformly thick circuit layer. Additional circuit layers may be formed atop a first circuit layer and so long as a conductive circuit pattern of an upper layer does not overshadow a conductive pattern for a circuit layer immediately beneath it, the insulator patterns for both layers can be formed simultaneously in a single laminating operation. Photolithographic techniques may be used to define the conductive circuit patterns as well as windows in the insulator patterns.

BRIEF DESCRIPTION OF THE DRAWINGS

A better understanding of the invention may be had from a consideration of the following detailed description taken in conjunction with the accompanying drawings, in which:

FIG. 1 is a sectioned side view illustrating a step in the manufacture of a printed circuit in accordance with the invention;

FIG. 2 is a sectioned side view illustrating a further step in the manufacture of a printed circuit in accordance with the invention;

FIG. 3 is a sectioned side view illustrating still another step in the manufacture of a printed circuit in accordance with the invention;

FIG. 4 is a sectioned side view illustrating a completed printed circuit in accordance with the invention;

FIG. 5 is a sectioned side view illustrating an alternative arrangement of a completed printed circuit in accordance with the invention;

FIG. 6 is a plan view, partly broken away, of a printed circuit in accordance with the invention configured as a film carrier;

FIG. 7 is a sectional side view taken along the line 7—7 and illustrating a step in the manufacture of the printed circuit shown in FIG. 6;

FIG. 8 is a sectional side view of the printed circuit shown in FIG. 6 taken along the line 7—7 and illustrating a step in the manufacture thereof;

FIG. 9 is a sectional side view of the printed circuit shown in FIG. 6 taken along the line 7—7 and illustrating a further step in the manufacture thereof;

FIG 10 is a sectional side view of the printed circuit shown in FIG. 6 taken along the line 7—7 and illustrating a still further step in the manufacture thereof;

FIG. 11 is a sectional side view of the printed circuit shown in FIG. 6 taken along the line 7—7;

FIG. 12 is a sectional side view illustrating a step in the manufacture of a printed circuit in accordance with the invention as a flexible cable;

FIG. 13 is a sectional side view illustrating a step in the manufacture of a printed circuit in accordance with the invention as a flexible cable; and FIG. 14 is a sectional side view illustrating a complete printed circuit in accordance with the invention configured as a flexible cable.

DETAILED DESCRIPTION

Referring now to FIG. 1, a printed circuit in accordance with the invention is manufactured by forming in a first circuit layer a first uniformly thick conductive circuit pattern 10 atop a polished surface of a temporary substrate 12 having deposited thereon a thin release layer including a layer 14 of nickel and an optional thin layer 16 of copper. The release layer forms a relatively weak bond with the polished surface of the stainless steel substrate 12 and permits the completed printed circuit to be readily separated from the substrate 12. The layers 14 and 16 are quite thin and can be readily removed by etching upon separation of the printed circuit from the substrate.

For most applications the first conductive pattern 10 may be formed by any suitable photolithographic technique such as plating a complete layer of copper or other conductive material to a selected circuit thickness which is preferably about 2 mils, masking the plated layer with photoresist to define a selected conductive circuit pattern, and etching away unwanted portions of the conductive layer in regions not protected by the photoresist. However, an alternative method which is required for some configurations of the printed circuit and which is preferred for most configurations is illustrated in FIG. 1. A first layer of photoresist 18 is applied to the copper layer 16 and photographically exposed and developed to remove the first layer of photoresist 18 in regions where conductive patterns are to be formed. The first conductive pattern 10 is then electrodeposited on the copper layer 16 of the polished surface of temporary substrate 12. A thin masking layer 17 of gold or nickel is first electroplated in the defined first conductive pattern 10 followed by electroplating of the conductive material such as copper, gold or nickel to the selected thickness. The thin masking layer protects the conductive circuit pattern when the release layer is later etched. A metallic, adhesive free bond is thus formed between the conductors of the first circuit layer and the polished surface of the substrate. To achieve a uniform thickness of the first layer of photoresist 18 it is preferred that a thin sheet of dry film photoresist be used to form the layer 18. Other photosensitive materials may be used so long as the layer is maintained uniformly thick with a flat planar surface. The layer 18 thus has a thickness of 2 mils which is uniform throughout and the first conductive pattern 10 is plated to a thickness equal to this uniform thickness of 2 mils.

Upon formation of the first conductive pattern 10 it is possible to strip the photoresist and apply a first insulator pattern of dielectric material to the printed circuit. However, in most instances, the second conductive pattern in a second circuit layer of the printed circuit immediately contiguous to the first layer will simply be an interconnect pattern which electrically connects the first conductive circuit pattern with a third conductive circuit pattern in a third circuit layer. In this event, the second conductive pattern 20 need not overlap or overshadow the first conductive pattern 10 and it becomes possible to first form the second conductive pattern in the second circuit layer and then simultaneously form the first insulator pattern 18 in the first circuit layer and a second insulator pattern in the second circuit layer. To accomplish this a second layer of photoresist 22 having a uniform thickness of approximately 2 mils throughout the second circuit layer is deposited atop the first conductive pattern 10 and portions of the first layer of photoresist 18 which remain after development to define the first conductive pattern 10. Since the first conductive pattern 10 is electrodeposited to a thickness of 2 mils it is flush with the top of the layer of photoresist 18 and the uniformly thick layer of photoresist 22 forms a continuous planar top surface. The second layer of photoresist 22 is then photographically exposed through a mask defining the second conductive pattern 20 and developed to expose the top surface of the first conductive pattern 10 in regions where the second conductive pattern 20 is to be formed. The second conductive pattern is then formed by electroplating the copper or other conductor within the exposed regions to a depth equal to the thickness of the second layer of photoresist 22.

The first layer of photoresist 18 and second layer of photoresist 22 are then completely stripped and a thin sheet of dry film flowable insulating material such as a sheet of uncured polyamideimide is laminated to the substrate 12 and first and second conductive patterns 10, 20 in a laminating press as illustrated in FIG. 2. Film sheets of polyamideimide in thicknesses of 2, 4 and 8 mils are available from Rhodia, Inc., 600 Madison Ave., New York, N.Y. 10022 under the name Kerimid 501. Even though it is provided in a solid film configuration, it is in an uncured condition and flows to fill all voids and conform to the preexisting first and second conductive circuit patterns 10, 20 when heated under pressure in a laminating press. Upon curing under a pressure of 100 lbs. per square inch at a temperature of 190° C. for two hours, the insulator material forms a strong bond with the copper of the first and second circuit patterns 10, 20.

The laminating press includes press plates 28, 30 in conventional opposed relationship and a silicon rubber pad 32 disposed adjacent the upper press plate 28. The silicon pad 32 provides a resilient biasing of the sheet of insulator material 24 to enable approximately uniform pressure to be applied throughout the surface as the insulator material 24 forms an uneven, wavy top surface when the material 24 flows into the open space voids between conductive segments of the first and second conductive patterns 10, 20.

After lamination, the excess insulating material 24 is removed by a suitable process such as sanding with very fine sandpaper to form a flat planar surface 34 which is coplanar with the top of the second circuit layer and second conductive pattern 20.

While the insulator material 24 in fact forms a single, integral mass, for convenience it will be deemed to form first and second insulator patterns 36, 38 which are coplanar and coextensive in thickness with the first and second conductive circuit patterns 10, 20 respectively. Together, the first conductive circuit pattern 10 and first insulator pattern 36 define a first circuit layer while the second conductive circuit pattern 20 and second insulator pattern 38 define a second circuit layer.

While the first and second insulator patterns 36, 38 have been shown as being formed simultaneously for convenience, it will be appreciated that in general the first insulator pattern 36 could be formed prior to formation of the second conductor pattern 20. In this event, it might be desirable to electroless deposit a thin layer of copper upon the first circuit layer before depositing the second layer of photoresist thereon. A conductive base is then available throughout the entire surface of the printed circuit to permit any desired circuit pattern to be formed by electroplating within the second circuit layer. After removal of the second layer of photoresist and before formation of the second insulator layer 38, unwanted regions of the thin electroless deposited copper layer should be removed in a rapid etch.

It will be appreciated that in the manufacturing process in accordance with this invention, the shape of the first and second insulator layers are defined by the shape of the preexisting first and second conductive patterns 10, 20. Because the conductive patterns 10, 20 are readily formed using photolithographic processes which are facilitated by maintenance of a flat, smooth, planar top surface throughout the various steps of the manufacturing process, high quality conductive lines can be formed with good resolution using economical processing techniques.

As shown in FIG. 3 a thin layer of copper 40 is electroless deposited upon the second circuit layer and a thin electrodeposition layer of copper follows to form a good conductive base throughout the area of the printed circuit on which a third conductive circuit pattern 42 can be formed by electrodeposition. The third conductive pattern 42 may have any desired shape and is illustrated as being interconnected by interconnects 44 and 46 defined by the second conductive circuit pattern 20 to the first conductive circuit pattern 10. The third conductive circuit pattern is defined with substantially the same process as the first and second conductive circuit patterns 10, 20 by depositing a 2 mil thick layer of dry film photoresist 48 atop the layer of copper 40, placing a photo mask atop the layer of photoresist 48, exposing the photoresist through a mask, and developing the photoresist to define open areas or voids where the third conductive circuit pattern 42 is to be formed. The third conductive circuit pattern 42 can then be electrodeposited within these voids to a thickness equal to the thickness of the third layer of photoresist 48. Because electroless and electrodeposition are used for formation of the conductive circuit patterns, even though they are referred to as separate first, second etc. layers, they in fact form a metalurgically integral, continuous copper structure wherever overlapping of conductive circuit patterns in immediately contiguous circuit layers occurs and a high quality electrically and thermally conductive path thus exists between all interconnected conductive patterns.

Before stripping of the third layer of photoresist 48 a thin layer 50 of nickel is electrodeposited atop the third conductive circuit pattern 42. The nickel layer 50 provides a stronger bond to a subsequent insulator pattern and serves as a mask to protect the third conductive circuit pattern 42. The third layer of photoresist 48 is removed and then a rapid etching operation removes unwanted portions of the thin copper layer 40 as illustrated in FIG. 4. The nickel layer 50 is sufficiently thin that it has no appreciable affect on the thickness of the third circuit layer. The third circuit layer is then completed by forming a third insulator layer 52 in a lamination operation as described in conjunction with FIG. 2. Again it is preferred that dry film sheet form uncured polyamideimide dry film be utilized as the dielectric adhesive material and after curing it is sanded until flush and coplanar with the top of the third conductive pattern 42. The third conductive pattern 42 and third insulator pattern 52 thus define a uniformly thick throughout, planar third circuit layer. Again, the third insulator pattern 52 bonds with the insulating material of the second insulator pattern wherever they are contiguous to form a continuous mass but it is helpful in understanding the invention to consider the third circuit layer as being a separate, definable planar layer of uniform thickness throughout. A fourth layer 54 of polyamideimide insulator material is then utilized as an adhesive to bond a permanent substrate 56 to the top circuit layer which is the third circuit layer in the present example. The substrate 12 is then removed from the printed circuit structure and the nickel and copper layers 14, 16 respectively are rapidly etched to complete the manufacture of the printed circuit as illustrated in FIG. 4. It will be appreciated that if desired, additional circuit layers can be formed using the above described methods prior to bonding of the substrate 56 to the top circuit layer.

In an alternative arrangement shown in FIG. 5, a fourth conductive circuit pattern 60 and a fifth conductive circuit pattern 62 are formed atop the third circuit layer. The sheet of polyamideimide film which forms the fourth insulator layer 64 is prepunched to provide clearanced apertures for receiving the conductive circuitry of the fourth conductive circuit pattern 60. It is preferable that the dry film for the fourth insulator layer 64 be slightly thicker than the fourth circuit layer and that there be sufficient clearance about the conductors of the fourth circuit pattern 60 to absorb any excess flow of insulator material as the fourth insulator layer is compressed slightly during bonding to a substrate 66. The top of the fourth conductive circuit pattern 60 thus contacts the surface of substrate 66 in a mating relationship that provides excellent heat transfer characteristics between the fourth conductive circuit pattern 60 and the substrate 66. Since the fourth conductive circuit pattern 60 is connected by copper conductors to the portions of the first conductive circuit pattern 10 adjacent the top surface, heat generated within circuit components mounted on the printed circuit may be readily communicated through leads of the circuit components to the portions 68 of the first conductive circuit layer pattern 10 and on through the fourth conductive circuit pattern 60 to the substrate 66 which may be a heavy aluminum substrate that readily absorbs and dissipates heat.

The substrate 66 has an aperture pattern for receiving the fifth conductive circuit pattern 62 and an electroless-deposited or electrodeposited layer of copper 70 or other bonding agent with good thermal conductivity may be used to provide excellent thermal communication between the fifth conductive circuit pattern 62 and the substrate 66. It will be appreciated that in general use of both the contacting fourth conductive circuit pattern 60 and the aperture penetrating fifth conductive circuit pattern 62 would not normally be found in a single printed circuit arrangement. Normally, only one arrangement or the other would be used but both have been shown in the printed circuit shown in FIG. 5 for convenience of illustration.

Referring now to FIGS. 6-11, a flexible film carrier 80 in accordance with the invention includes a first conductive circuit pattern 82 lying in a first circuit layer, an insulator pattern 84 lying in the first circuit layer, a second conductive circuit pattern 86 lying in a second circuit layer immediately atop and contiguous to the first circuit layer and apertures or windows 88 which form voids containing neither conductive nor insulator material. A pair of longitudinally extending, straight conductors 90, 92 are separated by a narrow layer of insulator material and extend along each edge of a row of film carrier patterns to provide a tear strip along which adjacent rows of carrier patterns can be easily separated by tearing to provide an elongated single row of interconnected film carrier circuit patterns.

Sprocket holes 93 are arranged in a conventional standard 35 mm ASTM motion picture film pattern to permit mechanical handling of the film carrier strips. The sprocket holes 93 are surrounded by circumferential copper rings 94 which increase the resistance of the sprocket holes 93 to deformation during mechanical handling and therefore improve the positioning resolution of the film patterns during automatic machine assembly. The rings 94 are formed as part of the first conductive circuit pattern 82.

A large aperture window 95 is formed at the center of each circuit conductor pattern and circuit leads extend in cantilever fashion from an outer periphery of an individual film carrier mounting circuit segment 98 where the leads are supportingly bonded to the insulator pattern through a supportive collar 100 to a small aperture window 96 which is approximately coextensive with a central chip receiving region. The collar 100 extends about the periphery of the central chip receiving region radially inward of the outer periphery.

At the radially inward ends, individual circuit leads 102 have raised connectors or plated bumps 102 which are located to mate with contact pads of an integrated circuit chip 104. An additional set of outer raised connectors or plated bumps 106 (only one exemplary bump being shown) may be selectively provided or omitted on the leads 101 in the region of the large aperture window 95 between its periphery and the supportive collar 100. Enlarged contact pads 110 are provided at the radially outward extremities of the leads 101 within the insulator pattern 84 surrounding the large aperture window 95.

This arrangement permits an integrated circuit chip 104 to be disposed over the small aperture window 96 and connected to the raised interconnecting bumps 102 with all leads 101 being simultaneously connected in a gang bonding process by application of heat for reflow soldering or by thermocompression bonding. In a next step after bonding of the integrated circuit chip 104, the chip 104 can be electrically tested utilizing the conveniently provided enlarged contact pads 110. If the integrated circuit is found to be acceptable, the leads 101 are sheared along the outer periphery of the large aperture window 95 and mechanically aligned with a lead frame of an integrated circuit package or other circuit pattern for simultaneous gang bonding of all leads thereto.

Only a single outer raised connector 106 is shown by way of illustration but either all of the leads 101 or none of the leads 101 would have such a connector. Furthermore, the integrated circuit chip may be mounted in either an upright or upside down orientation and the outer connector 106 may be placed on either the same side or the opposite side of the leads 101 as the connectors 102 which mate with pads on the integrated circuit chip 104.

The collar 100 provides a tremendous improvement in the strength of the individual circuit leads 101 as they extend first from the outer periphery of the window 95 and then from the bonded integrated circuit chip 104 after bonding and shearing. Conventional film carrier printed circuit structures do not provide this supportive collar 100 and problems frequently occur with unwanted displacement of the cantilevered circuit leads 101.

Referring now to FIG. 7, the film carrier circuit 80 as shown in FIG. 6 is manufactured by first forming the first conductive circuit pattern 82 on a substrate 112 as described in conjunction with FIG. 1 except that a positive dry film photoresist is utilized in a first resist layer 114 to define the first conductive circuit pattern 82.

Referring now to FIG. 8, only a portion of the positive dry film resist in first resist layer 114 is further exposed and developed with resist remaining in regions 116 in which the windows 88 are to be formed.

A sheet of polyamideimide insulator material at least equal in thickness to the first conductive circuit pattern 82 is then laminated to the first conductive circuit pattern 82, substrate 112 and remaining photoresist 116 as described in conjunction with FIG. 2. The laminated structure is illustrated in FIG. 8.

Sanding of the top surface of the laminated structure with a very fine sandpaper results in the uniformly thick planar first circuit layer having a flat planar top surface 120 as illustrated in FIG. 9 with the insulator pattern 84 filling the voids in the partially removed photoresist layer 104 and forming the supportive collar 100.

As illustrated in FIG. 10, a second layer of uniformly thick dry film photoresist 122 may then be deposited atop the first circuit layer and the connectors 102 formed within voids defined in the layer 102 by electrodeposition. A thin layer 124 of solder, tin or gold may be formed by electroplating atop the connectors 102 to facilitate bonding of the connectors 102 to the mating pads of IC chip 104. The remaining portions of the second layer of photoresist 122 and remaining portions of the first layer of photoresist 116 may then be removed to define the windows 88 as illustrated in the completed structure shown in FIG. 11. It will be appreciated that the outer connectors 106 could be formed on the opposite side of the film carrier structure by forming them as the first conductor circuit pattern in the printed circuit structure.

The film carriers thus formed facilitate the bonding of IC chips to lead frames of dual in-line packages or other package configurations while simultaneously testing circuit performance in an automated process. It will be appreciated that even though not explicitly shown in FIGS. 6-11, additional layers of conductive circuit patterns could be selectively formed in accordance with the teachings of this invention.

Referring now to FIG. 12, an improved flexible cable may be manufactured in accordance with the teachings of the invention by forming on a polished stainless steel substrate 126 a first layer conductive circuit pattern 128 having conductors extending longitudinally along the cable or in any other selected pattern within voids defined by a first layer of photoresist 130. The photoresist is then stripped and insulator material is laminated to the structure as described in conjunction with FIG. 2. However, instead of utilizing a single sheet of dry film polyamideimide, glass fibers are sandwiched between two sheets of dry film polyamideimide and the three insulating layers are simultaneously laminated to the structure as described in conjunction with FIG. 2. As illustrated in FIG. 13, the polyamideimide flows to completely surround the fiberglass structure which may be a woven fiberglass mat or cloth 132 and to also fill the voids separating adjacent elements of the first layer conductive circuit pattern 128. The cloth 132 becomes fully embedded in the insulator material. After removing excess insulator material including embedded fiberglass by sanding or otherwise to form a flat planar top surface 134 flush with the top of the first layer conductive circuit pattern, a second layer 136 of insulating material comprising woven fiberglass sandwiched between two opposed sheets of dry film polyamideimide material is laminated to the surface 134 to improve strength and durability and provide an insulating coating on one side of the flexible cable. It has been found that incorporation of a woven fiberglass cloth within the insulating structure not only greatly increases the tensile strength of the resulting flexible cable but also greatly reduces the coefficient of thermal expansion from 28 to approximately 14 parts per million/°C.

While there have been shown and described above particular arrangements of a printed circuit and methods of manufacture therefor in accordance with the invention for the purpose of enabling a person of ordinary skill in the art to make and use the invention, it will be appreciated that the invention is not limited thereto. Accordingly, any modifications, variations or equivalent arrangements within the scope of the attached claims should be considered to be within the scope of the invention.

What is claimed is:

1. The method of manufacturing a high density printed circuit with closely spaced, fine line conductors comprising the steps of:

photolithographically forming a metallic conductive circuit pattern having a selected, uniform thickness atop a smooth planar surface of a temporary substrate with a metallic, adhesive free bond between the circuit pattern and the smooth surface of the substrate;

laminating a preformed sheet of a flowable setting insulator material having a uniform thickness equal to the selected thickness of the conductive circuit pattern to the planar surface and said conductive circuit pattern formed thereon;

removing insulator material from the conductive circuit pattern to expose conductive material of the circuit pattern and form a circuit layer with a smooth surface defined partly by the insulator material and partly by the conductive material, the surface being sufficiently smooth to permit the formation of an additional circuit layer thereon using a photolithographic technique as set forth in the preceding steps; and removing the printed circuit from the temporary substrate.

2. The method according to claim 1 above, wherein the conductive circuit pattern comprises copper, the substrate comprises stainless steel, and the insulator material comprises polyamideimide.

3. The method according to claim 1 above, wherein the insulator material comprises dry film polyamideimide.

4. The method according to claim 3 above, further comprising between the steps of removing insulator material and removing the printed circuit the step of forming a second conductive circuit layer on said smooth surface of the circuit layer by photolithographically forming a second metallic conductive circuit pattern having a selected uniform thickness atop the smooth surface of the first mentioned circuit layer and laminating a preformed sheet of flowable setting insulator material having a uniform thickness equal to the selected thickness of the second conductive circuit pattern to the smooth surface of the first mentioned circuit layer and said circuit pattern thereon.

5. The method of manufacturing a printed circuit comprising the steps of:

depositing a uniformly thick layer of photosensitive material upon a polished planar surface of a substrate;

exposing and developing the photosensitive material to define a selected conductive circuit pattern in void regions from which the photosensitive material is removed;

electroplating conductive material upon said polished planar surface to a uniform thickness no greater than the thickness of the layer of photosensitive material in said void regions;

removing the remaining photosensitive material to define a selected insulator pattern in regions mutually exclusive of the conductive circuit pattern; and laminating a preformed, uniformly thick sheet of thermosetting flowable insulator material equal in thickness to the thickness of the conductive material to the planar surface and selected circuit pattern.

6. The method of manufacturing a printed circuit according to claim 5 above, further comprising the step of removing insulator material from the conductive material of the circuit pattern to expose the conductive material and form a circuit layer with a smooth surface defined partly by the insulator material and partly by the conductive material, the surface being sufficiently smooth to permit the formation of an additional layer thereon using a photolithographic technique by repeating the preceding steps.

7. The method of manufacturing a printed circuit according to claim 6 above, comprising the further step of forming a second circuit layer upon the first-mentioned circuit layer by repeating the above steps with the smooth surface of the first-mentioned circuit layer being used in place of the surface of the substrate.

8. The method of manufacturing a printed circuit according to claim 5, 6 or 7 above, comprising the further step of separating the substrate from the printed circuit.

9. The method of manufacturing a printed circuit according to claim 5, 6 or 7 above, wherein the insulator material is polyamideimide.

* * * * *